(12) United States Patent
Andre et al.

(10) Patent No.: US 8,923,041 B2
(45) Date of Patent: Dec. 30, 2014

(54) SELF-REFERENCED SENSE AMPLIFIER FOR SPIN TORQUE MRAM

(71) Applicant: Everspin Technologies, Inc., Chandler, AZ (US)

(72) Inventors: Thomas Andre, Austin, TX (US); Syed M. Alam, Austin, TX (US); Chitra Subramanian, Mahopac, NY (US)

(73) Assignee: Everspin Technologies, Inc., Chandler, AZ (US)

( * ) Notice: Subject to any disclaimer, the term of this patent is extended or adjusted under 35 U.S.C. 154(b) by 8 days.

(21) Appl. No.: 13/835,426

(22) Filed: Mar. 15, 2013

(65) Prior Publication Data

US 2013/0272060 A1 Oct. 17, 2013

Related U.S. Application Data

(60) Provisional application No. 61/622,953, filed on Apr. 11, 2012.

(51) Int. Cl.
| | |
|---|---|
| *G11C 11/00* | (2006.01) |
| *G11C 11/16* | (2006.01) |
| *G11C 7/02* | (2006.01) |
| *G11C 13/00* | (2006.01) |

(52) U.S. Cl.
CPC ........ *G11C 11/1673* (2013.01); *G11C 11/1675* (2013.01); *G11C 7/02* (2013.01); *G11C 2013/0057* (2013.01)
USPC .......................................... 365/158; 365/173

(58) Field of Classification Search
USPC ................................................. 365/158, 173
See application file for complete search history.

(56) References Cited

U.S. PATENT DOCUMENTS

| 6,717,399 | B2 * | 4/2004 | Luetzow et al. ......... 324/207.12 |
|---|---|---|---|
| 6,744,663 | B2 | 6/2004 | Garni et al. |
| 6,760,266 | B2 | 7/2004 | Garni et al. |
| 6,842,366 | B2 | 1/2005 | Tanizaki et al. |
| 6,856,565 | B2 | 2/2005 | Ooishi et al. |
| 6,870,760 | B2 | 3/2005 | Tsang |
| 6,888,743 | B2 | 5/2005 | Durlam et al. |
| 6,901,005 | B2 | 5/2005 | Perner et al. |
| 6,954,373 | B2 | 10/2005 | Perner |
| 7,012,841 | B1 * | 3/2006 | Nahas ...................... 365/189.09 |
| 7,102,945 | B2 | 9/2006 | Tsuchida et al. |
| 7,123,505 | B2 | 10/2006 | Jeong |
| 7,436,698 | B2 | 10/2008 | Lin et al. |
| 7,554,836 | B2 | 6/2009 | Chen et al. |
| 7,826,260 | B2 | 11/2010 | Zhu et al. |
| 7,852,660 | B2 | 12/2010 | Zhu et al. |
| 7,852,665 | B2 | 12/2010 | Chen et al. |
| 7,876,604 | B2 | 1/2011 | Zheng et al. |
| 7,940,592 | B2 | 5/2011 | Reed et al. |
| 8,233,324 | B2 * | 7/2012 | Sharon et al. ............ 365/185.17 |

(Continued)

OTHER PUBLICATIONS

Search Report issued Oct. 4, 2013 in PCT/US13/35613.

*Primary Examiner* — Michael Tran
(74) *Attorney, Agent, or Firm* — Ingrassia Fisher & Lorenz, P.C.

(57) ABSTRACT

Circuitry and a method provide a plurality of timed control and bias voltages to sense amplifiers and write drivers of a spin-torque magnetoresistive random access memory array for improved power supply noise rejection, increased sensing speed with immunity for bank-to-bank noise coupling, and reduced leakage from off word line select devices in an active column.

23 Claims, 10 Drawing Sheets

(56) References Cited

U.S. PATENT DOCUMENTS

| | | |
|---|---|---|
| 2003/0206432 A1* | 11/2003 | Munden et al. ............... 365/158 |
| 2006/0044882 A1* | 3/2006 | Nahas ...................... 365/189.09 |
| 2007/0133297 A1* | 6/2007 | Cernea .................... 365/185.22 |
| 2009/0323402 A1 | 12/2009 | Li et al. |
| 2010/0321985 A1 | 12/2010 | Yang |
| 2011/0194337 A1 | 8/2011 | Wang et al. |
| 2012/0069638 A1* | 3/2012 | Matsuda et al. .............. 365/158 |

\* cited by examiner

200
-PRIOR ART-

SELF-REFERENCED SENSE AMPLIFIER FOR SPIN TORQUE MRAM

CROSS REFERENCE TO RELATED APPLICATION

This application claims the benefit of U.S. Provisional Application No. 61/622,953 filed 11 Apr. 2012.

TECHNICAL FIELD

The exemplary embodiments described herein generally relate to integrated magnetic devices and more particularly relate to methods for reading magnetoresistive memories.

BACKGROUND

Magnetoelectronic devices, spin electronic devices, and spintronic devices are synonymous terms for devices that make use of effects predominantly caused by electron spin. Magnetoelectronics are used in numerous information devices to provide non-volatile, reliable, radiation resistant, and high-density data storage and retrieval. The numerous magnetoelectronics information devices include, but are not limited to, Magnetoresistive Random Access Memory (MRAM), magnetic sensors, and read/write heads for disk drives.

Typically an MRAM includes an array of magnetoresistive memory elements. Each magnetoresistive memory element typically has a structure that includes multiple magnetic layers separated by various non-magnetic layers, such as a magnetic tunnel junction (MTJ), and exhibits an electrical resistance that depends on the magnetic state of the device. Information is stored as directions of magnetization vectors in the magnetic layers. Magnetization vectors in one magnetic layer are magnetically fixed or pinned, while the magnetization direction of another magnetic layer may be free to switch between the same and opposite directions that are called "parallel" and "antiparallel" states, respectively. Corresponding to the parallel and antiparallel magnetic states, the magnetic memory element has low (logic "0" state) and high (logic "1" state) electrical resistance states, respectively. Accordingly, a detection of the resistance allows a magnetoresistive memory element, such as an MTJ device, to provide information stored in the magnetic memory element.

There are two completely different methods used to program the free layer: field switching and spin-torque switching. In field-switched MRAM, current carrying lines adjacent to the MTJ bit are used to generate magnetic fields that act on the free layer. In spin-torque MRAM, switching is accomplished with a current pulse through the MTJ itself. The angular momentum carried by the spin-polarized tunneling current causes reversal of the free layer, with the final state (parallel or antiparallel) determined by the polarity of the current pulse. A reset current pulse will cause the final state to be parallel or logic "0". A set current pulse, in the opposite polarity of the reset current pulse, will cause the final state to be antiparallel or logic "1". Spin-torque transfer is known to occur in MTJ devices and giant magnetoresistance devices that are patterned or otherwise arranged so that the current flows substantially perpendicular to the interfaces, and in simple wire-like structures when the current flows substantially perpendicular to a domain wall. Any such structure that exhibits magnetoresistance has the potential to be a spin-torque magnetoresistive memory element.

Spin-torque MRAM (ST-MRAM), also known as spin-torque-transfer RAM (STT-RAM), is an emerging memory technology with the potential for non-volatility with unlimited endurance and fast write speeds at much higher density than field-switched MRAM. Since ST-MRAM switching current requirements reduce with decreasing MTJ dimensions, ST-MRAM has the potential to scale nicely at even the most advanced technology nodes. However, increasing variability in MTJ resistance and sustaining relatively high switching currents through bit cell select devices in both current directions can limit the scalability of ST-MRAM.

Referring to FIG. 1, a high ST-MRAM MTJ resistance variation and low magnetoresistance (MR) results in an overlapping distribution of resistances for high state bits 102 and low state bits 104. Known referenced read/sensing schemes using reference bits cannot distinguish high and low states successfully for 100% of the bits. Even if the number of bits in the overlapped region 101 is very low (or even zero), due to low MR and high resistance variation of the high and low state bits, a mid-point reference distribution can overlap with low or high state distributions causing read failure. Self-referenced read that references the bit being read/sensed to itself is known in the prior art to address the aforementioned sensing problem. For example, see U.S. Pat. No. 6,744,663 describing a destructive self-referenced read that requires 100% of the bits being read to be toggled or set to either high or low state during a read operation. The toggle or set to high state or reset to low state operation adds to read power consumption. And U.S. Patent Publication 2009/0323403 describes a non-destructive self-referencing read that does not have the full MR for sensing signal development resulting in a very low sensing signal.

Data stored in memory is defined in banks. A rank is a plurality of banks in a first direction (column) and a channel is a plurality of banks in a second direction (row). A process for accessing the memory comprises several clock cycles required for row and column identification and a read or write operation. The bandwidth for the data transfer may comprise a row of many thousands of bits.

FIG. 2 is a block diagram of an exemplary memory system 200 including a memory controller 202 that performs data transfer between a processor 204 and the memory 206. The memory controller 202 and the processor 204 may reside on the same chip 208, or they may reside on separate chips (not shown). The memory 206 comprises a non-volatile memory 218 using magnetic tunnel junctions, preferably ST-MRAM, for data storage. The non-volatile memory 218 comprises a plurality of non-volatile memory banks 228.

A control signal bus 232 provides control signals, such as chip select, row access strobe, column access strobe, and write enable, from the memory controller 202 to the non-volatile memory 218. An address bus 237 and a data line 240 couples the memory controller 202 to the non-volatile memory 218. Other control and clock signals may exist between the memory controller 202 and non-volatile memory 218 that are not shown in FIG. 2. Furthermore, an address bus 237, a control signal bus 232, and data line 240 may include multiple lines or bits.

In operation, an ACTIVATE operation for an address can be initiated in non-volatile memory 218. Subsequently, the memory controller 202 initiates READ or WRITE operations in the non-volatile memory 218. The data from non-volatile memory 218 is read after the non-volatile memory ACTIVATE operation is complete. Access to a bank in a double data rate (DDR) memory generally includes an ACTIVATE operation, followed by several READ/WRITE operations and a PRECHARGE operation. The ACTIVATE operation opens a row (or page) of typically 1,000 or more bits. The READ/

WRITE operation performs the reading or writing of columns, e.g., 128 bits, in the open row. The PRECHARGE operation closes the row.

The ACTIVATE operation in DDR ST-MRAM performs a destructive self-referenced read where read data in the memory array is reset to logic state "0" during the read process. The read data from the array is stored in local data-store latches at the completion of the ACTIVATE operation. READ/WRITE operations subsequent to the ACTIVATE operation are performed to the local data-store latches instead of the ST-MRAM array. Small time interval, for e.g. 5 nanoseconds, between READ/WRITE operations is feasible due to fast latch operations.

The ACTIVATE operation can be initiated by an ACTIVATE command or any other command that performs the same operation. During a PRECHARGE operation, the data from local data-store latches are written back to the memory array, and as a result, that page is considered closed or not accessible without a new ACTIVATE operation. The PRECHARGE operation can be initiated by a PRECHARGE or AUTO-PRECHARGE command or any other command that performs the same operation. ACTIVATE operation in one bank may partially overlap with operations, such as ACTIVATE, PRECHARGE, READ, or WRITE, in other banks. The self-referenced sensing operation during ACTIVATE is susceptible to power supply noise from operations in other banks.

Accordingly, it is desirable to provide a self-referenced sense amplifier circuit for a ST-MRAM and a method of timing control signals and bias voltages thereto for improved power supply noise rejection, increased sensing speed with immunity for bank-to-bank noise coupling, and reduced leakage from off word line select devices in an active column. Furthermore, other desirable features and characteristics of the exemplary embodiments will become apparent from the subsequent detailed description and the appended claims, taken in conjunction with the accompanying drawings and the foregoing technical field and background.

BRIEF SUMMARY

A method and apparatus are provided for reading a spin-torque magnetoresistive random access memory.

A first exemplary embodiment is a method for reading data from each of a plurality of memory cells in a spin torque magnetoresistive memory array, the method including applying a read voltage across a source line and a bit line coupled to a memory cell; applying a write current in a first direction through the memory cell to write a first state; reapplying the read voltage across the source line and the bit line; and applying a programmable offset current to one of the bit line or the source line.

A second exemplary embodiment is a method of reading data from each of a plurality of memory cells in a spin torque magnetoresistive memory array, the method including applying a read voltage across a magnetic tunnel junction within a memory cell; converting a current through the magnetic tunnel junction under the applied read voltage into a sample voltage; storing the sample voltage in a capacitor; applying a first write current through the magnetic tunnel junction to reset the memory cell to a first state; reapplying the read voltage across the magnetic tunnel junction; using the stored voltage and a programmable offset current to create a current reference; converting the difference between the reference current and the current through the magnetic tunnel junction under the reapplied read voltage to generate an evaluation voltage; and comparing the sample voltage and the evaluation voltage.

A third exemplary embodiment is a spin torque magnetoresistive memory array having a plurality of memory cells, each memory cell selectively coupled between a bit line and a source line, the spin torque magnetoresistive memory array including column selection circuitry coupled to first and second ends of the source lines and to a first end of the bit lines and configured to select a specific bit line; global bias circuitry configured to provide a plurality of timed bias voltages; sense amplifiers and write drivers circuitry coupled between the column selection circuitry and the global bias circuitry, the sense amplifiers and write drivers circuitry configured to receive the timed bias voltages; apply a read voltage across the source line and the bit line coupled to a memory cell on the selected bit line; apply a write current in a first direction through the memory cell to write a first state; reapply the read voltage across the source line and the bit line; and apply a programmable offset current to the bit line.

BRIEF DESCRIPTION OF THE DRAWINGS

The present invention will hereinafter be described in conjunction with the following drawing figures, wherein like numerals denote like elements.

DETAILED DESCRIPTION

Figure 1:
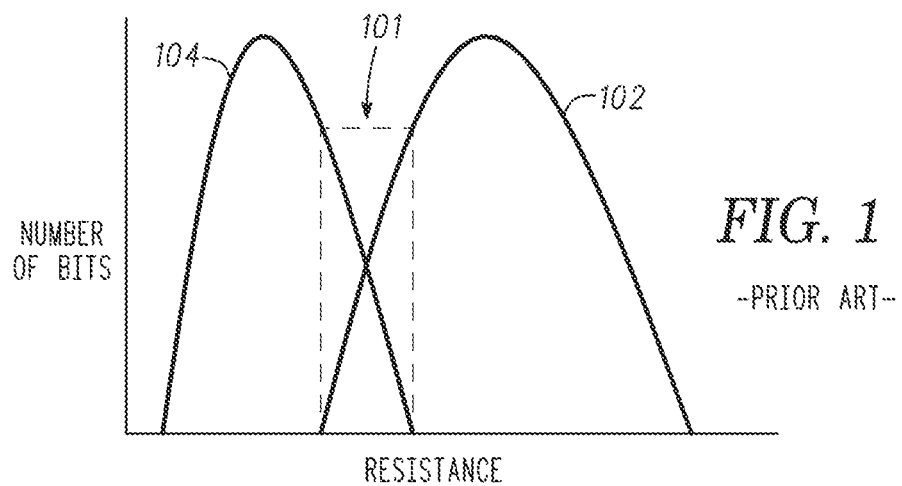
FIG. 1 is a graph of known high and low states of the resistance of a number of bits of an array.
Figure 2:
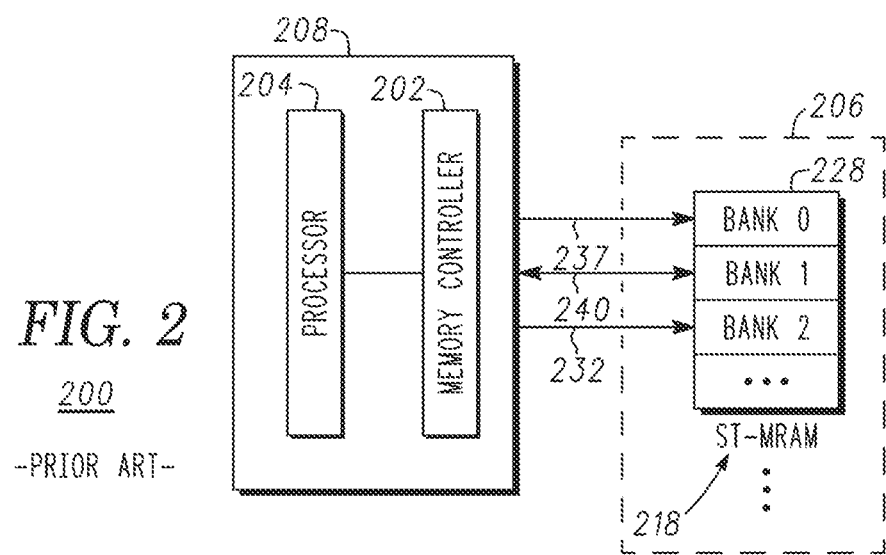
FIG. 2 is a known block diagram of a memory interconnection system comprising of a memory controller between a processor and non-volatile memory that may be used to apply the methods in accordance with the exemplary embodiments.

The following detailed description is merely illustrative in nature and is not intended to limit the embodiments of the subject matter or the application and uses of such embodiments. Any implementation described herein as exemplary is not necessarily to be construed as preferred or advantageous over other implementations. Furthermore, there is no intention to be bound by any expressed or implied theory presented in the preceding technical field, background, brief summary, or the following detailed description.

For simplicity and clarity of illustration, the drawing figures depict the general structure and/or manner of construction of the various embodiments. Descriptions and details of well-known features and techniques may be omitted to avoid unnecessarily obscuring other features. Elements in the drawings figures are not necessarily drawn to scale: the dimensions of some features may be exaggerated relative to other elements to assist improve understanding of the example embodiments.

Terms of enumeration such as "first," "second," "third," and the like may be used for distinguishing between similar elements and not necessarily for describing a particular spatial or chronological order. These terms, so used, are interchangeable under appropriate circumstances. The embodiments of the invention described herein are, for example, capable of use in sequences other than those illustrated or otherwise described herein.

The terms "comprise," "include," "have" and any variations thereof are used synonymously to denote non-exclusive inclusion. The term "exemplary" is used in the sense of "example," rather than "ideal."

In the interest of conciseness, conventional techniques, structures, and principles known by those skilled in the art may not be described herein, including, for example, standard magnetic random access memory (MRAM) process techniques, fundamental principles of magnetism, and basic operational principles of memory devices.

During the course of this description, like numbers may be used to identify like elements according to the different figures that illustrate the various exemplary embodiments.

Techniques and technologies may be described herein in terms of functional and/or logical block components, and with reference to symbolic representations of operations, processing tasks, and functions that may be performed by various computing components or devices. Such operations, tasks, and functions are sometimes referred to as being computer-executed, computerized, software-implemented, or computer-implemented. In practice, one or more processor devices can carry out the described operations, tasks, and functions by manipulating electrical signals representing data bits at memory locations in the system memory, as well as other processing of signals. The memory locations where data bits are maintained are physical locations that have particular electrical, magnetic, optical, resistive, or organic properties corresponding to the data bits. It should be appreciated that the various clock, signal, logic, and functional components shown in the figures may be realized by any number of hardware, software, and/or firmware components configured to perform the specified functions. For example, an embodiment of a system or a component may employ various integrated circuit components, e.g., memory elements, digital signal processing elements, logic elements, look-up tables, or the like, which may carry out a variety of functions under the control of one or more microprocessors or other control devices.

For the sake of brevity, conventional techniques related to reading and programming memory, and other functional aspects of certain systems and subsystems (and the individual operating components thereof) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter.

A magnetoresistive random access memory (MRAM) array includes write current drivers and sense-amplifiers positioned near a plurality of magnetoresistive bits. A write, or program, operation begins when a current of either one of the two different and opposite polarities, set or reset, is applied through the magnetic storage element, e.g., MTJ. Such write mechanism is employed in spin torque transfer (STT) or spin torque (ST) MRAM. The spin-torque effect is known to those skilled in the art. Briefly, a current becomes spin-polarized after the electrons pass through the first magnetic layer in a magnetic/non-magnetic/magnetic trilayer structure, where the first magnetic layer is substantially more stable than the second magnetic layer. The higher stability of the first layer compared to the second layer may be determined by one or more of several factors including: a larger magnetic moment due to thickness or magnetization, coupling to an adjacent antiferromagnetic layer, coupling to another ferromagnetic layer as in a SAF structure, or a high magnetic anisotropy. The spin-polarized electrons cross the nonmagnetic spacer and then, through conservation of spin angular momentum, exert a spin torque on the second magnetic layer that causes precession of its magnetic moment and switching to a different stable magnetic state if the current is in the proper direction. When net current of spin-polarized electrons moving from the first layer to the second layer exceeds a first critical current value, the second layer will switch its magnetic orientation to be parallel to that of the first layer. If a bias of the opposite polarity is applied, the net flow of electrons from the second layer to the first layer will switch the magnetic orientation of the second layer to be antiparallel to that of the first layer, provided that the magnitude of the current is above a second critical current value. Switching in this reverse direction involves a fraction of the electrons reflecting from the interface between the spacer and the first magnetic layer and traveling back across the nonmagnetic spacer to interacting with the second magnetic layer.

Magnetoresistance (MR) is the property of a material to change the value of its electrical resistance depending on its magnetic state. Typically, for a structure with two ferromagnetic layers separated by a conductive or tunneling spacer, the resistance is highest when the magnetization of the second magnetic layer is antiparallel to that of the first magnetic layer, and lowest when they are parallel. The difference in resistance as determined by the MR is used to read the state of the magnetic storage element during sensing operation.

Circuitry and a biasing method provide a plurality of timed control signals and bias voltages to sense amplifiers and write drivers of a spin-torque magnetoresistive random access memory array for improved power supply noise rejection, increased sensing speed with immunity for bank-to-bank noise coupling, and reduced leakage from off word line select devices in an active column. Transistor switches and decoupling capacitors are used to isolate a portion of the bias voltages during read operation. PMOS-follower circuitry is coupled to ends of the source line or bit line that regulate the source line or bit line voltage to a predetermined voltage above ground for improved power supply noise rejection and reduced sub-threshold leakage of OFF word line select devices in the same column. A preamplifier includes NMOS-follower circuitry coupled to ends of the source line or bit line to improve power supply noise rejection. A programmable offset current is applied to the preamplifier circuitry magnitude and timing of which improves sensing speed and noise immunity.

Figure 3:
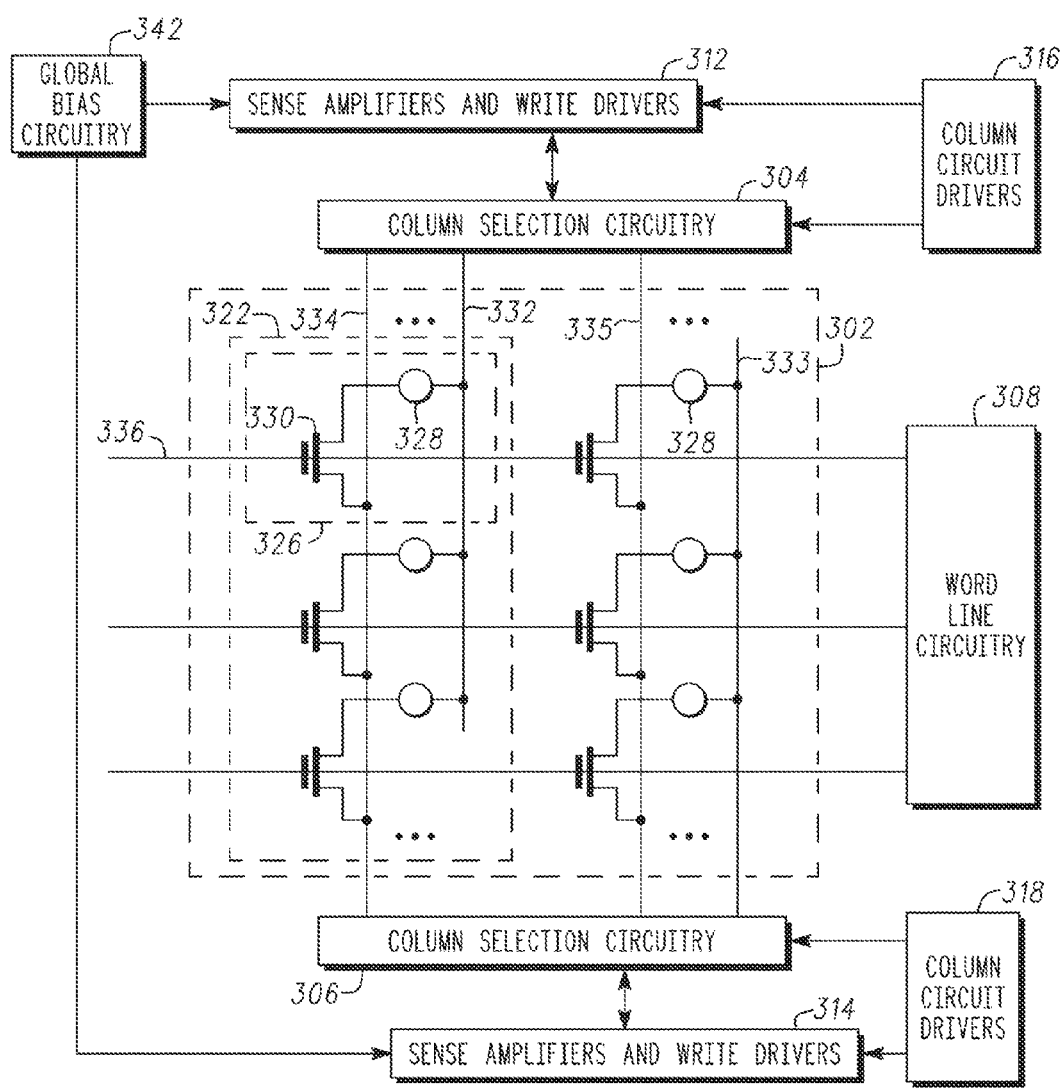
FIG. 3 is a partial general circuit diagram of an ST-MRAM array in accordance with a first exemplary embodiment.

FIG. 3 is a partial schematic diagram of an ST-MRAM array 300 in accordance with the exemplary embodiment. An ST-MRAM bit cell array 302 is coupled to first and second column selection circuitry 304, 306 and to word line circuitry 308. First and second sense amplifiers and write drivers circuitry 312, 314 are coupled to the first and second column selection circuitry 304, 306, respectively. First column circuit drivers circuitry 316 is coupled to the first column selection circuitry 304 and the first sense amplifiers and write drivers circuitry 312. Second column circuit drivers circuitry 318 is coupled to the second column selection circuitry 306 and the second sense amplifiers and write drivers circuitry 314. Global bias circuitry 342 is coupled to first sense amplifiers and write drivers circuitry 312 and second sense amplifiers and write drivers circuitry 314. The write drivers operate to write data to the bit cell array 302 and the sense amplifiers operate by reading data from the array 302. For simplicity and brevity, other known circuit blocks in a memory, such as data storage latches, address decoders, and timing circuitry, are not shown in FIG. 3.

The ST-MRAM array 300 includes a plurality of columns 322 with each column including a plurality of magnetic bit cells 326. Each magnetic bit cell 326 includes a magnetic tunnel junction device 328 and a word line select transistor 330. Within each column 322, each magnetic tunnel junction device 328 is coupled between a bit line 332, 333 and a first electrode of a word line select transistor 330, while a second electrode of each word line select transistor 330 is coupled to a source line 334, 335. A control electrode of each word line select transistor 330 is coupled to a word line 336 within the word line circuitry 308. Each one of the word lines 336 is coupled to a single row of word line select transistors. The word line select transistor 330 preferably is a thin-oxide device with low threshold voltage for a higher current drive capability.

The first exemplary embodiment described above provides voltages at both ends of each source lines 334, 335, while alternating adjacent bit lines 332, 333 are coupled, one at a first end and the other at the opposed second end. The source line resistance is one fourth of the resistance of an array connected only at one end of the source line, which leads to a higher write voltage and higher effective MR during read. Word line circuitry 308 comprises word line drivers that may provide a charge pumped voltage on word line 336. The charge pumped word line voltage reduces the resistance of the word line select transistor 330.

In accordance with the exemplary embodiment, a global bias circuit 342 is coupled to the sense amplifiers and write drivers 312, 314 for providing bias voltages thereto as subsequently described in more detail.

Figure 4A:
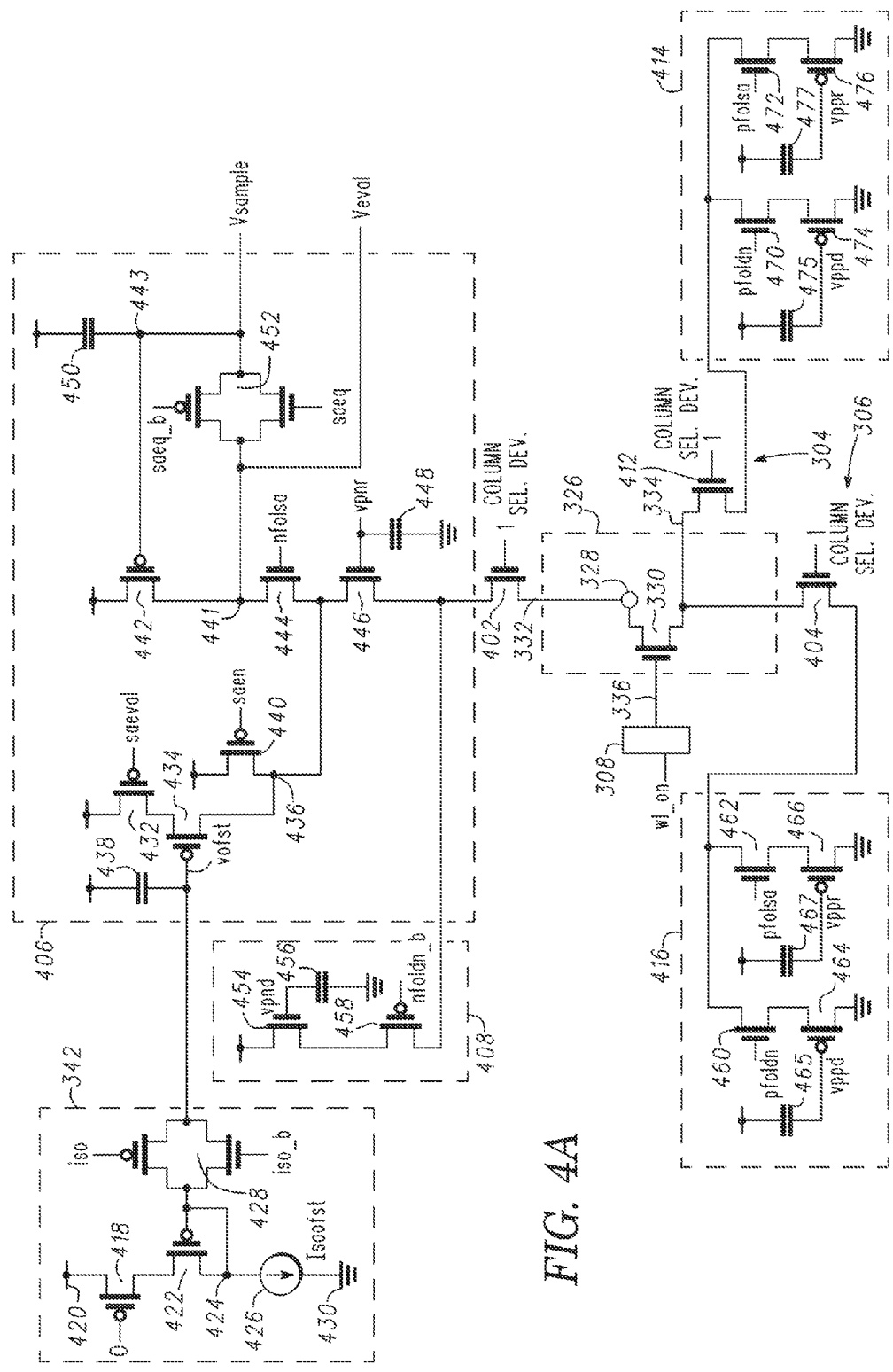
FIG. 4A is a schematic of a sense amplifier in accordance with the first exemplary embodiment.

Referring to FIG. 4A, a more detailed schematic of the ST-MRAM array of FIG. 3 includes the memory bit cell 326 selectively coupled between the bit line 332 and source line 334, and to the word line circuitry 308. The word line circuitry 308 receives an input signal w1_on. The memory bit cell 326 is further coupled between the column selection circuitry 304 comprising a column select device 402, another column select device 412, and the column selection circuitry 306 comprising a column select device 404. The sense amplifiers and write drivers 312 comprise a preamplifier circuitry 406, an NMOS-follower circuitry 408, and PMOS-follower circuitry 414 for controlling voltages on the bit line 332 and source line 334 during self-referenced read operation. The sense amplifiers and write drivers 314 comprise a PMOS-follower circuitry 416 for controlling voltages on the source line 334. The preamplifier circuitry 406 is coupled to the global bias circuitry 342 for receiving an offset voltage vofst.

The global bias circuitry 342 includes a PMOS switching transistor 418 having a first current carrying electrode connected to a first reference voltage 420, a second current carrying electrode connected to a first current carrying electrode of a PMOS mirror transistor 422, and a gate coupled to receive a signal, for example, a "0" or low voltage level. The transistor 422 has both a second current carrying electrode and a gate connected to node 424. A current source 426 is coupled between node 424 and a second reference voltage 430 and provides a current Isaofst. The current source 426 is only one example for providing a reference current to the circuit. This current can be provided in multiple other ways, for example, by using an active current mirror instead of the current source. Furthermore, the magnitude of the current may be programmable by writing to multiple bits of a register. A transmission gate 428 has a first terminal connected to node 424, a second terminal connected to provide the offset voltage vofst to the preamplifier circuitry 406, and gates coupled to receive timing control signals iso and iso_b. The global bias circuitry may comprise of other circuitry, for example for generating other bias voltages for write and read circuitry including vpnd, vppd, vpnr, and vppr of FIG. 4A, that are not shown for brevity. Each one of the vpnd, vppd, vpnr, and vppr voltages may further include isolation devices in the global bias circuitry 342.

The preamplifier stage 406 includes a PMOS switch transistor 432 having a first current carrying electrode coupled to the reference voltage 420, a second current carrying electrode connected to a first current carrying electrode of PMOS mirror transistor 434, and a gate coupled to receive an evaluation signal saeval. The PMOS mirror transistor 434 has a second current carrying electrode connected to node 436 and a gate coupled to receive the offset voltage vofst. A capacitor 438 is coupled between the reference voltage 420 and the offset voltage vofst. A PMOS switch transistor 440 has a first current carrying electrode connected to the reference voltage 420, a second current carrying electrode connected to node 436, and a gate coupled to receive the enable signal saen.

A PMOS transistor 442 has a first current carrying electrode connected to the reference voltage 420, a second current carrying electrode connected to node 441, and a gate connected to node 443. An NMOS switch transistor 444 has a first current carrying electrode connected to node 441, a second current carrying electrode connected to node 436, and a gate coupled to receive the signal nfolsa. An NMOS-follower transistor 446 has a first current carrying electrode connected to node 436, a second current carrying electrode connected to the first current carrying electrode of transistor 402, and a gate coupled to receive the voltage vpnr. A capacitor 448 is coupled between the gate of transistor 446 and the second reference voltage 430. A capacitor 450 is coupled between the first reference voltage 420 and node 443, and a transmission gate 452 has a first current carrying electrode connected to node 441, a second current carrying electrode connected to node 443, and gates coupled to receive timing control signals saeq and saeq_b. The nodes 443 and 441 provide the voltages Vsample and Veval as discussed subsequently in more detail.

The NMOS-follower circuitry 408 includes an NMOS transistor 454 having a first current carrying electrode connected to the first reference voltage 420, a gate coupled to bias signal vpnd which is further coupled to the second reference voltage 430 by a capacitor 456, and a second current carrying electrode connected to a first current carrying electrode of PMOS switch transistor 458. The PMOS switch transistor 458 has a gate coupled to receive the signal nfoldn_b, and a second current carrying electrode connected to the first current carrying electrode of transistor 402.

The PMOS-follower circuitry 416 includes a first NMOS switch transistor 460 and a second NMOS switch transistor 462 having a first current carrying electrode coupled to the column select device 404, and a gate coupled to receive the signals pfoldn and pfolsa, respectively. A PMOS-follower transistor 464 has a first current carrying electrode connected to a second current carrying electrode of transistor 460, a second current carrying electrode connected to the second reference voltage 430, and a gate coupled to receive a voltage vppd and to the first reference voltage 420 by a capacitor 465. A PMOS-follower transistor 466 has a first current carrying electrode connected to a second current carrying electrode of transistor 462, a second current carrying electrode connected to the second reference voltage 430, and a gate coupled to receive a voltage vppr and to the first reference voltage 420 by a capacitor 467. In an alternate embodiment, the capacitor 467 may be coupled between vppr and vpnr of the preamplifier circuitry 406.

The PMOS-follower circuitry 414 includes a first NMOS switch transistor 470 and a second NMOS switch transistor 472 having a first current carrying electrode coupled to the column select device 412, and a gate coupled to receive the signals pfoldn and pfolsa, respectively. A PMOS-follower transistor 474 has a first current carrying electrode connected to a second current carrying electrode of transistor 470, a second current carrying electrode connected to the second reference voltage 430, and a gate coupled to receive a voltage vppd and to the first reference voltage 420 by a capacitor 475. A PMOS-follower transistor 476 has a first current carrying electrode connected to a second current carrying electrode of transistor 472, a second current carrying electrode connected to the second reference voltage 430, and a gate coupled to receive a voltage vppr and to the first reference voltage 420 by a capacitor 477. In an alternate embodiment, the capacitor 477 may be coupled between vppr and vpnr of the preamplifier circuitry 406.

Figure 4B:
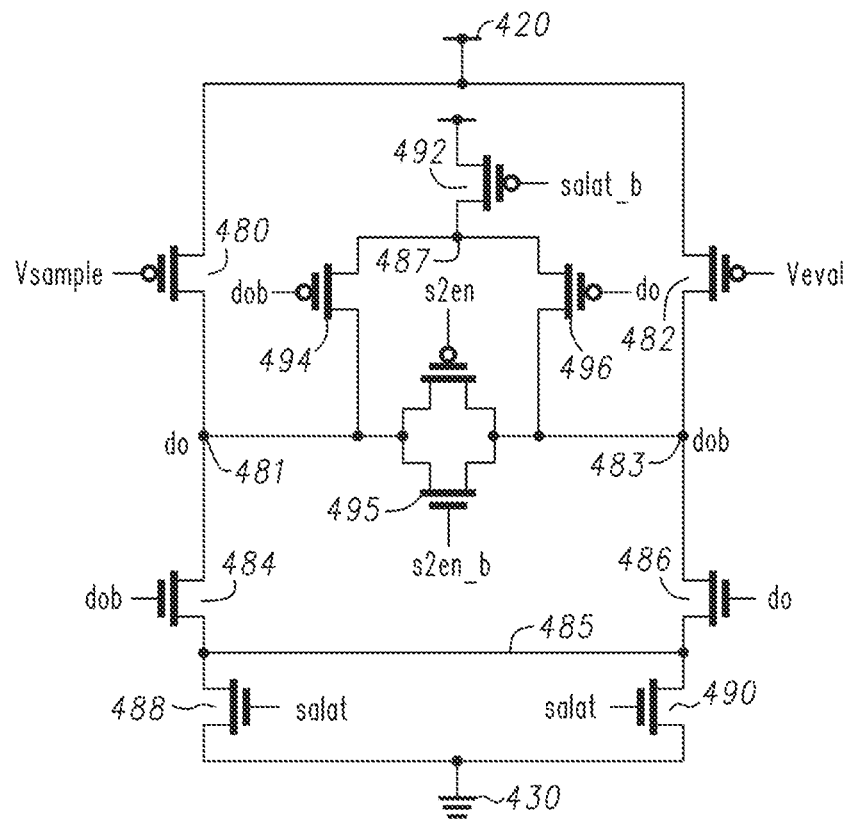
FIG. 4B is a schematic of a comparator and latch circuitry of the sense amplifier in accordance with the first exemplary embodiment.

Referring now to FIG. 4B, a comparator and latch circuitry of the sense amplifier include PMOS transistors 480 and 482, both having a first current carrying electrode connected to the first reference voltage 420, a gate coupled to receive the voltages Vsample (node 443) and Veval (node 441), respectively, and a current carrying electrode connected to nodes 481 (node do) and 483 (node dob), respectively. NMOS transistor 484 has a first current carrying electrode connected to node 481, a gate coupled to node 483, and a second current carrying electrode connected to node 485. NMOS transistor 486 has a first current carrying electrode connected to node 483, a gate coupled to node 481, and a second current carrying electrode connected to node 485. A transistor 488 has a first current carrying electrode connected to node 485, a second current carrying electrode connected to the second reference voltage 430, and a gate coupled to receive the signal salat. A transistor 490 has a first current carrying electrode connected to node 485, a second current carrying electrode connected to the second reference voltage 430, and a gate coupled to receive the signal salat.

A PMOS transistor 492 has a first current carrying electrode connected to the first reference voltage 420, a second current carrying electrode connected to node 487, and a gate coupled to receive the signal salat b. PMOS transistor 494 has a first current carrying electrode connected to node 487, a second current carrying electrode connected to node 481, and a gate coupled to node 483. PMOS Transistor 496 has a first current carrying electrode connected to node 487, a second current carrying electrode connected to node 483, and a gate coupled to node 481. A transmission gate 495 has a first current carrying electrode connected to node 481, a second current carrying electrode connected to node 483, and gates coupled to receive the signals s2en and s2en_b.

A NAND gate 498 is configured to receive node 481 (do) and the signal s2en as inputs. The output of the NAND gate 498 is coupled to inverter 497. The output of the inverter is dlat signal which is the final output of the sense amplifier. The state of dlat indicates the state of the magnetic tunnel junction 328. A NAND gate 499 is configured to receive node 483 (dob) and the signal s2en as inputs. The output of the NAND gate 499 is floating i.e. is not connected to any other circuitry.

Figure 4B:
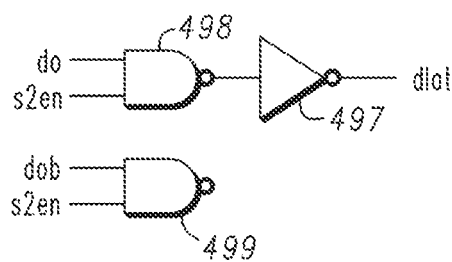
Figure 5:
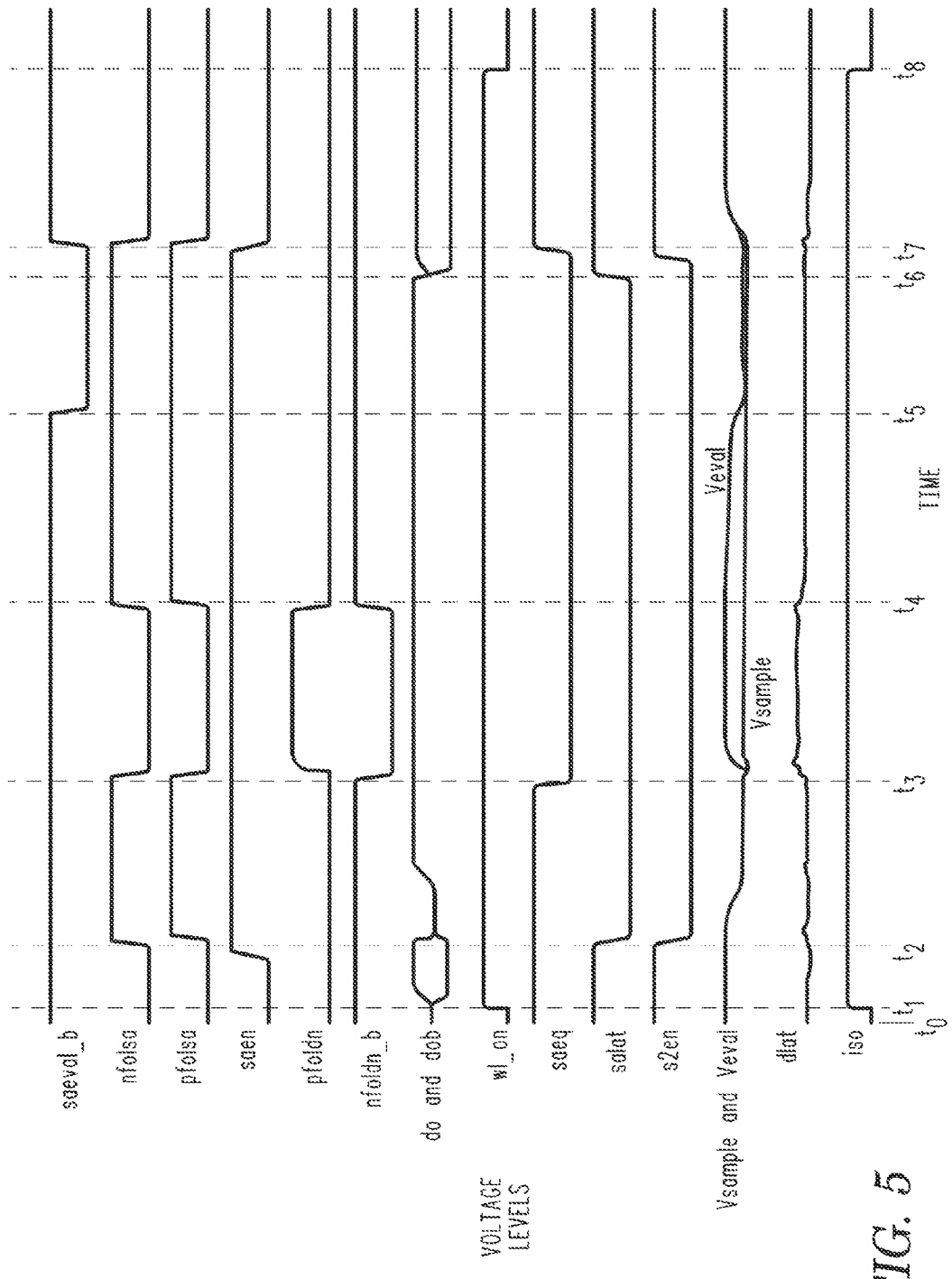
FIG. 5 is a timing diagram describing the operation of reading 0s from the first exemplary embodiment.

FIG. 5 is a timing diagram for various signals when a read 0 operation is performed. For illustrative purposes, the description of FIG. 5 refers to elements mentioned above in connection with FIGS. 3 and 4. The state of the signals at time t0 represents the stand-by or idle state when no read operation is being performed. At time t1, signal w1_on transitions from a low to a high voltage level indicating the start of the read operation. The signal w1_on enables a word line 336 selection through the word line circuitry 308. At time t1, the signal iso also transitions from a low to a high voltage level. While not shown in FIG. 5, the signal iso_b (the inversion of the signal iso) would transition with the signal iso_b. The signals iso and iso_b disables the transmission gate 428 and isolates the voltage vofst of the preamplifier 406 from global bias circuitry 342. Each one of the vpnd, vppd, vpnr, and vppr voltages may include isolation devices in the global bias circuitry 342 (not shown in FIG. 4A). At time t1, each one of the vpnd, vppd, vpnr, and vppr voltages will also be isolated for subsequent read operation.

Subsequently, at around time t2, the signals nfolsa, pfolsa, and saen transition from low to high voltage levels and the signals salat and s2en transition from high to low voltage levels. The signals s2en and salat equalizes the do and dob nodes while eliminating any static current between the reference voltages 420 and 430 in the comparator and latch circuitry of the sense amplifier. The signal nfolsa and saen enables the preamplifier circuitry 406 which applies a predetermined read voltage based on the voltage level of vpnr to the bit line 332 through the enabled column select device 402. The signal pfolsa enables the read PMOS follower transistors 466 and 476 in PMOS follower circuitry 416 and 414, respectively, to apply another predetermined read voltage, based on the magnitude of voltage vppr, to source line 334 through enabled column select devices 404 and 412, respectively. The magnitudes of the predetermined read voltages applied to the bit line 332 and source line 334 are based on an applied voltage to a high end of the resistance range during a high (1) state of the memory cell such that the applied voltage is less that the voltage required to switch the memory cell from a high (1) to low (0) state.

At around time t3, the signals saeq, nfolsa, pfolsa and nfoldn_b transitions to low voltage levels while pfoldn transitions to a high voltage level. The falling transitions of nfolsa and pfolsa terminate the application of read voltages to the bit line 332 and source line 334. The signal saeq (and saeq_b, inversion of saeq not shown in FIG. 5) disables the transmission gate 452 that isolates the charged capacitor 450 from node 441 in the preamplifier circuitry 406. The falling transition of nfoldn_b initiates the application of a predetermined write 0 voltage to the bit line 332 by the NMOS-follower circuitry 408 through the enabled column select device 402. The rising transition of pfoldn enables the write PMOS-follower transistors 464 and 474 in PMOS follower circuitry 416 and 414, respectively, to apply another predetermined write 0 voltage, based on the magnitude of voltage vppd, to source line 334 through enabled column select devices 404 and 412, respectively. At time t4, the write 0 voltage applications to the bit line and source line are terminated by the transitioning pfoldn and nfoldn_b signals, while the read voltage applications are reinitiated by the transitions in the signals nfolsa and pfolsa.

Subsequently, at time t5, the signal saeval_b transitions from a high to a low voltage level enabling the PMOS switch transistor 432 that further allows the PMOS-mirror transistor 434 to add the programmable offset current Isaofst to node 436 due to the voltage level vofst. Note that the voltage vofst is isolated from global bias circuitry 342 during this time. Furthermore, the coupling of the isolated voltage vofst to the reference voltage 420 through the capacitor 438 increases the power supply noise rejection of the PMOS-mirror transistor 434. Subsequently, at time t6, the rising transition of salat enables the comparator and latch circuitry that senses the difference between Vsample and Veval nodes and amplifies the difference in do and dob nodes. At time t7, the rising transition of s2en enables the NAND gate 498 and the state of node do is transferred to final sense amplifier output node dlat. Furthermore, the falling transitions of nfolsa, pfolsa, saen, and rising transition of saeq terminate the read voltage applications on the bit line 332 and source line 334, and subsequently bring the state of the preamplifer circuitry 406 and the PMOS-follower circuitry 414 and 416 back to standby or idle state as in time t0. When the magnetic tunnel junction 328 is in state 0 (low resistance state) at time t0, the voltage level of Veval is higher than that of Vsample between time t5 and t6 and the dlat output is 0 following time t7 as illustrated in FIG. 5. At time t8, the signals wl_on and iso transitions back to a low voltage level.

Figure 6:
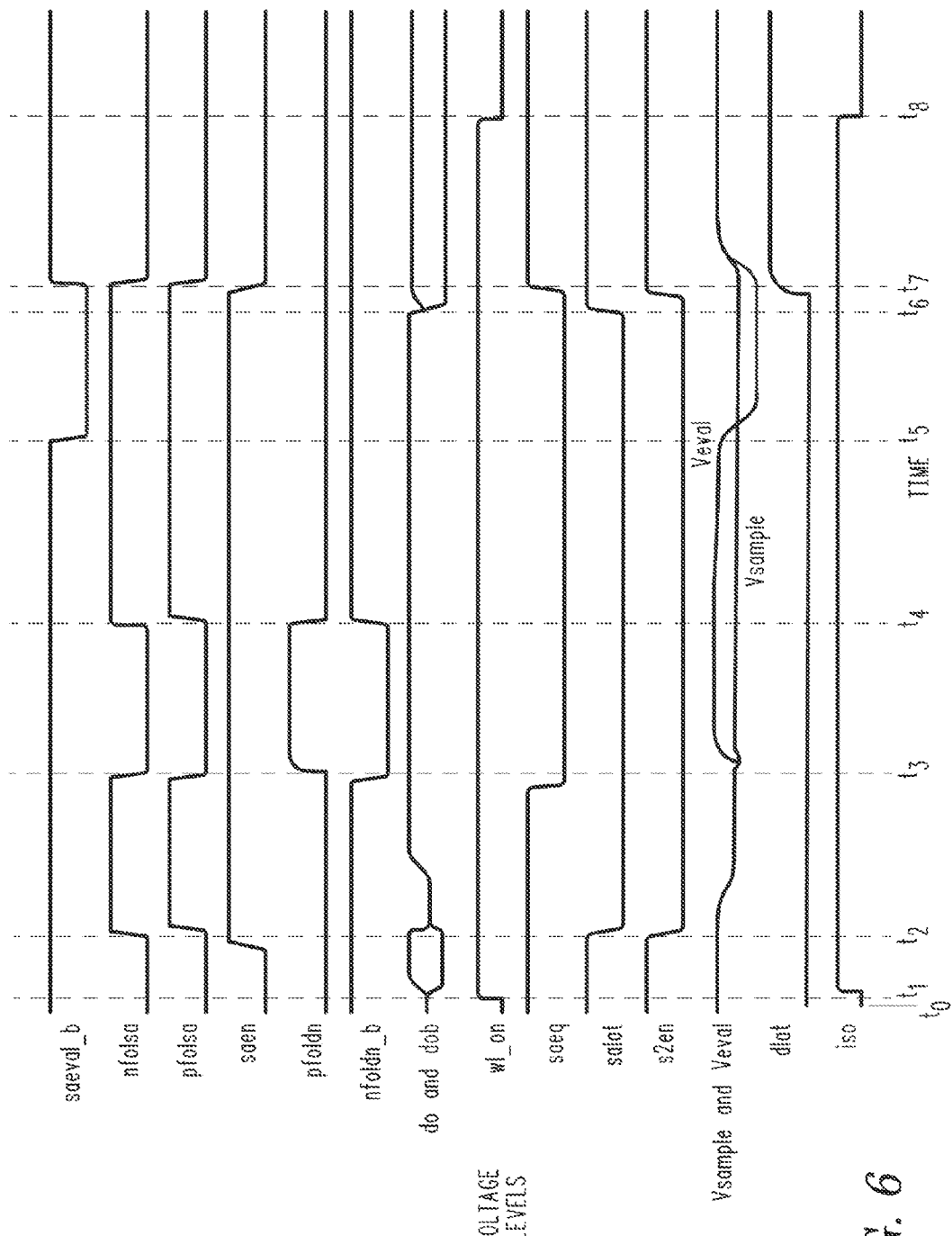
FIG. 6 is a timing diagram describing the operation of reading 1s from the first exemplary embodiment.

FIG. 6 is a timing diagram for various signals when a read 1 operation is performed. The operating sequence of the signals wl_on, iso, salat, s2en, nfolsa, pfolsa, saen, salat, pfoldn, nfoldn_b, and saeval_b are the same as described in FIG. 5. When the magnetic tunnel junction 328 is in state 1 (high resistance state) at time t0, the voltage level of Veval is lower than that of Vsample between time t5 and t6 and the dlat output is 1 following time t7 as illustrated in FIG. 6. Note that there is a delay between reapplying the predetermined read voltages on the bit line 332 and source line 334 at time t4 and applying the programmable offset current to the preamplifier circuitry 406 at time t5 in both cases of reading 0 (FIGS. 5) and 1 (FIG. 6). The programmable offset current, Isaofst, is applied at a later time t5 after reapplying the predetermined read voltages at time t4. Furthermore, this delay can be a programmable delay which can be set during runtime by writing to multi-bit registers or during power-up by read from multiple fuse programmed bits. The delay in applying the programmable offset current increases the sensing speed as described next in more detail.

Figure 7:
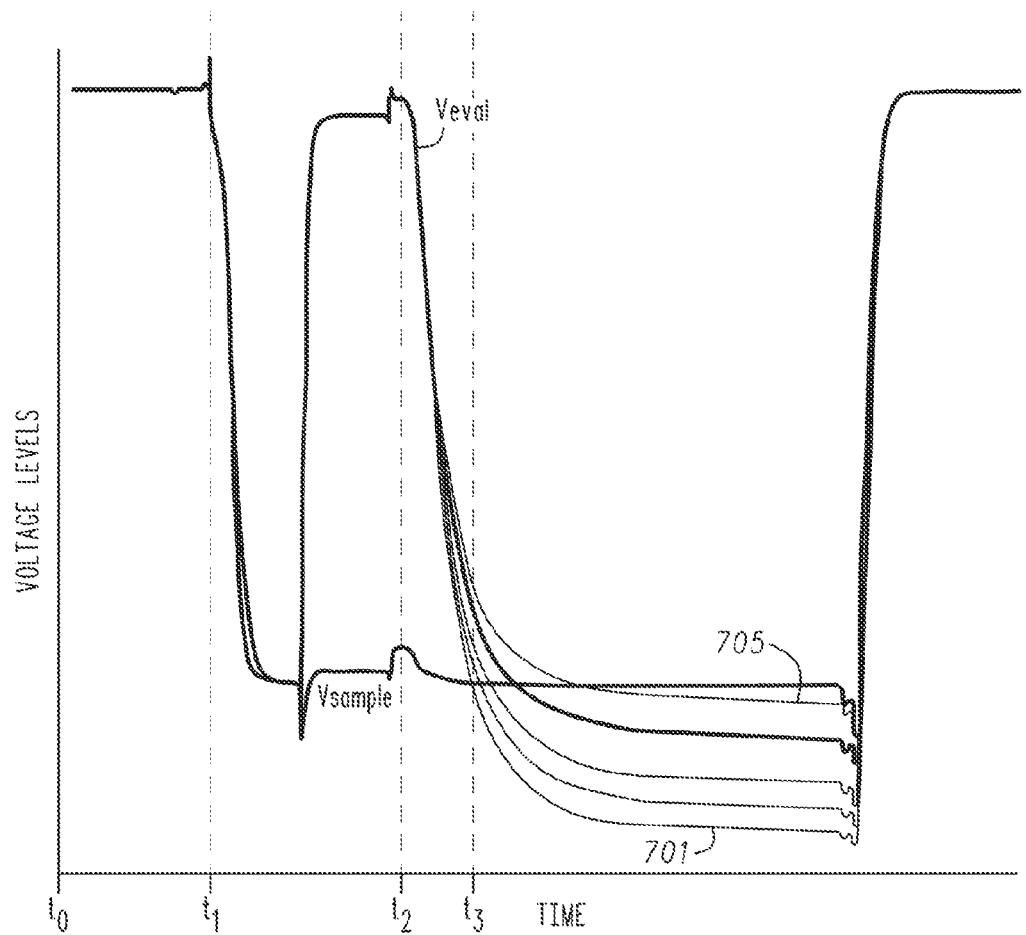
FIG. 7 is a timing diagram of voltages versus time describing the operation of reading 1s from the first exemplary embodiment without a delay in applying an offset current.

FIG. 7 is a graph of the voltages Vsample and Veval versus time when a read 1 operation is performed without a delay in the offset current Isaofst for various magnitudes of Isaofst. Referring to FIG. 7, reapplying the predetermined read voltages on the bit line 332 and source line 334 occurs at time t2 concurrently with applying the offset current Isaofst. Furthermore, FIG. 7 shows multiple traces of the voltage Veval where trace 701 corresponds to when Isaofst is zero, trace 705 corresponds to a positive non-zero Isaofst current level, and the traces in between traces 701 and 705 correspond to increasing amplitude of Isaofst between zero and a non-zero current level. After time t2, the voltage Veval transitions to a lower voltage level and crosses Vsample at a cross-over point (time t3 for trace 701 in FIG. 7) during a read 1 operation. Note that the time to reach the cross-over point increases with increasing current amplitude of Isaofst as illustrated by the Veval traces up to trace 705. This delay with increasing current amplitude of Isaofst reduces the speed of the read 1 operation. However, an increased current amplitude of Isaofst is desirable for increased noise immunity of the read operation.

Figure 8:
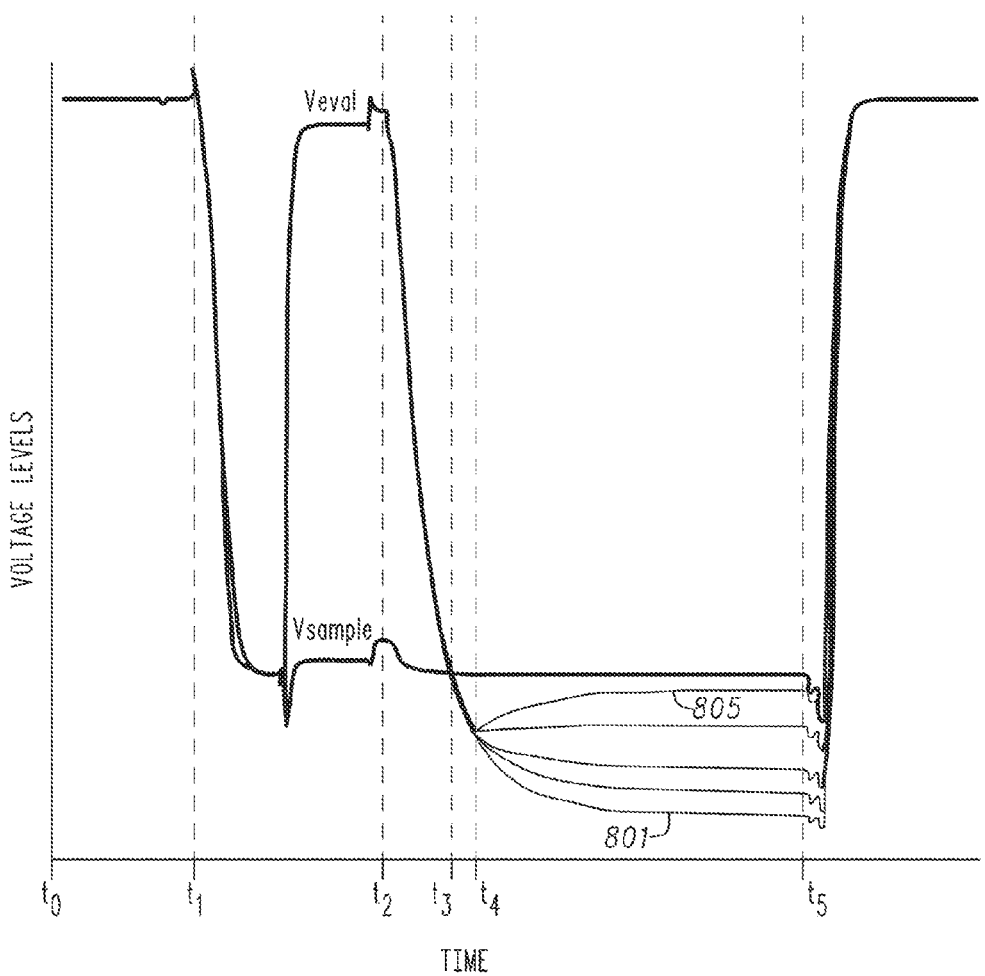
FIG. 8 is a timing diagram of voltages versus time describing the operation of reading 1s from the first exemplary embodiment with a delay in applying an offset current.

FIG. 8 is a graph of the voltages Vsample and Veval versus time when a read 1 operation is performed with a delay in the offset current Isaofst. The offset current Isaofst is applied at time t4 which is delayed from time t2. Consequently, the cross-over point occurring at time t3 in FIG. 8 is not delayed despite the different current amplitudes of Isaofst as illustrated by the different traces, trace 801 to trace 805, of Veval in FIG. 8. Therefore, sensing speed is not reduced due to the delayed application of the offset current Isaofst during a read 1 operation.

Figure 9:
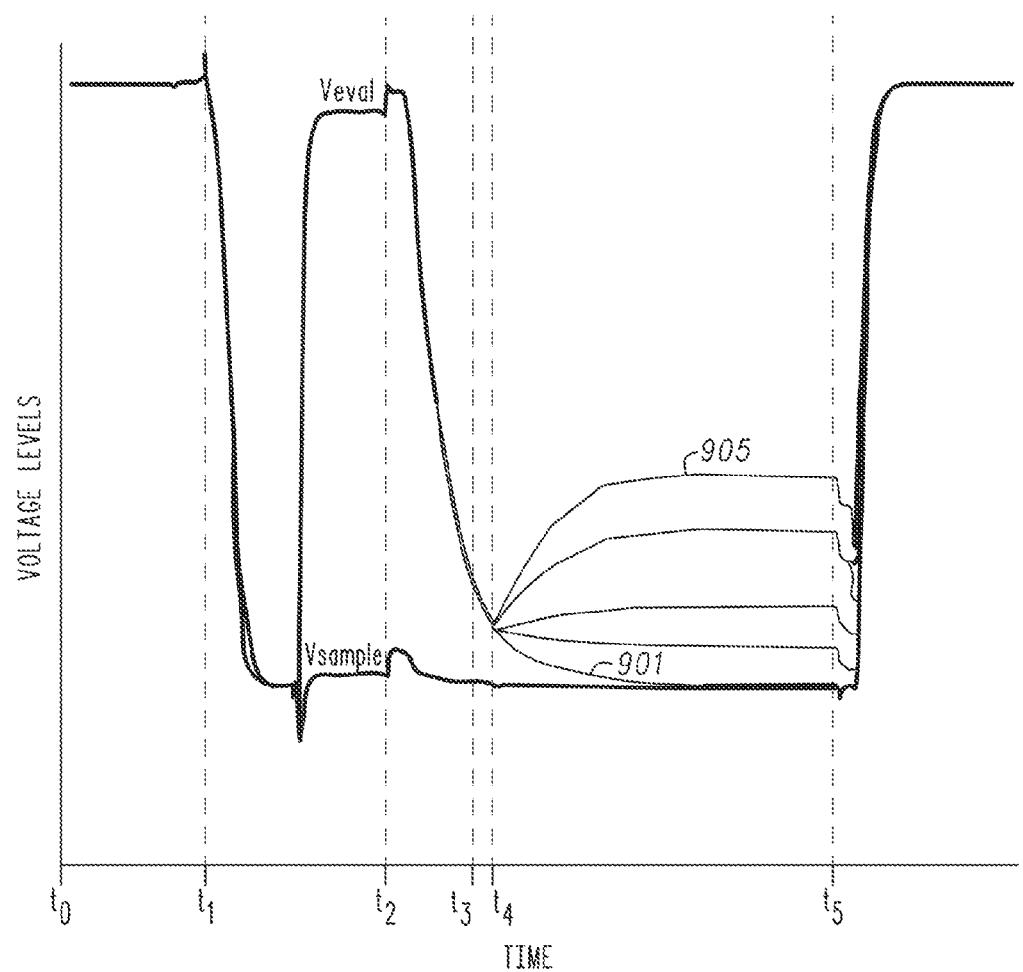
FIG. 9 is a timing diagram of voltages versus time describing the operation of reading 0s from the first exemplary embodiment with a delay in applying an offset current.

FIG. 9 is a graph of the voltages Vsample and Veval versus time when a read 0 operation is performed with a delay in the offset current Isaofst. Referring to FIG. 9, Veval trace 901 corresponds to when Isaofst is zero, trace 905 corresponds to a positive non-zero Isaofst current level, and the traces in between traces 901 and 905 correspond to increasing amplitude of Isaofst between zero and a non-zero current level. During a read 0 operation, the voltage Veval trace 905 will provide the maximum sensing signal due to the difference in the voltage levels of Veval and Vsample between time t4 and t5. Hence, increased current amplitude of Isaofst is desirable for noise immunity and increased speed during a read 0 operation. On the other hand, referring to FIG. 8, increasing the current amplitude of Isaofst reduces the sensing signal (the difference in the voltage levels of Veval and Vsample between time t4 and t5 in FIG. 8) during a read 1 operation. Consequently, the magnitude of the offset current Isaofst is set to a level that approximately equalizes the sensing signals in both read 1 and read 0 operations. In another embodiment, the magnitude of the offset current Isaofst can be set to maximize the sensing signal in a read 0 operation.

Figure 10:
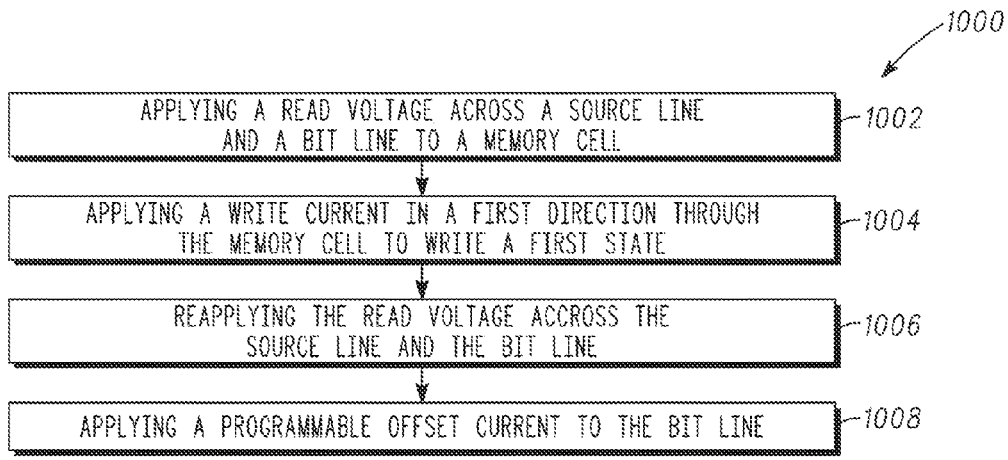
FIG. 10 is a flow chart of the steps for reading using a self-referenced sense amplifier in accordance with an exemplary embodiment.
Figure 11:
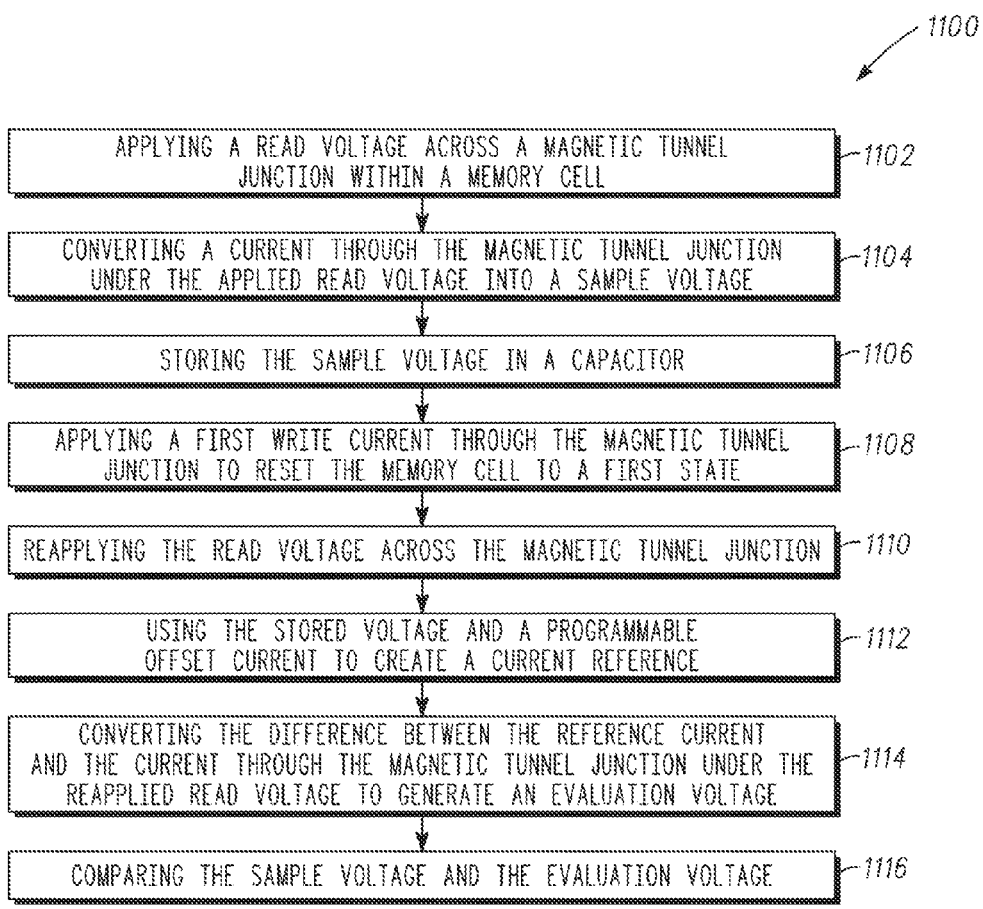
FIG. 11 is a flow chart of the steps for reading using a self-referenced sense amplifier in accordance with another exemplary embodiment.

FIGS. 10 and 11 are flow charts that illustrate an exemplary embodiment of methods 1000 and 1100, respectively. The various tasks performed in connection with methods 1000 and 1100 may be performed by software, hardware, firmware, or any combination thereof. For illustrative purposes, the following description of processes 1000 and 1100 may refer to elements mentioned above in connection with other FIGS. In practice, portions of methods 1000 and 1100 may be performed by different elements of the described system. It should be appreciated that methods 1000 and 1100 may include any number of additional or alternative tasks, the tasks shown in FIGS. 10 and 11 need not be performed in the illustrated order, and methods 1000 and 1100 may be incorporated into a more comprehensive procedure or process having additional functionality not described in detail herein. Moreover, one or more of the tasks shown in FIGS. 10 and 11 could be omitted from an embodiment of the methods 1000 and 1100 as long as the intended overall functionality remains intact.

FIG. 10 is a flow chart of a first exemplary method for reading data from each of a plurality of memory cells in a spin torque magnetoresistive memory array, the method including applying 1002 a read voltage across a source line and a bit line coupled to a memory cell; applying 1004 a write current in a first direction through the memory cell to write a first state; reapplying 1006 the read voltage across the source line and the bit line; and applying 1008 a programmable offset current. Applying 1008 a programmable offset current may comprise applying a programmable offset current to the one of the bit line, source line, or the circuitry coupled to the bit line or the source line. The method 1000 may further include isolating a bias voltage associated with the programmable offset current prior to applying 1002 a read voltage across a source line and a bit line coupled to a memory cell. Applying 1002 a read voltage across a source line and a bit line coupled to a memory cell further comprises applying a voltage at a first end of a source line using a first PMOS follower circuitry and at a second end of a source line using a second PMOS follower circuitry, and applying another voltage of a higher magnitude by at least the read voltage to at least one end of a bit line using a preamplifier circuitry.

A second exemplary method (FIG. 11) for reading data from each of a plurality of memory cells in a spin torque magnetoresistive memory array includes applying 1102 a read voltage across a magnetic tunnel junction within a memory cell; converting 1104 a current through the magnetic tunnel junction under the applied read voltage into a sample voltage; storing 1106 the sample voltage in a capacitor; applying 1108 a first write current through the magnetic tunnel junction to reset the memory cell to a first state; reapplying 1110 the read voltage across the magnetic tunnel junction; using 1112 the stored voltage and a programmable offset current to create a current reference; converting 1114 the difference between the reference current and the current through the magnetic tunnel junction under the reapplied read voltage to generate an evaluation voltage; and comparing 1116 the sample voltage and the evaluation voltage. The method 1100 may further include selectively applying a second write current through the magnetic tunnel junction to set the memory cell to a second state in response to 1116 the comparing of the sample voltage and evaluation voltage.

While at least one exemplary embodiment has been presented in the foregoing detailed description, it should be appreciated that a vast number of variations exist. Furthermore, the exemplary embodiments may be applied to a memory array comprising any resistive memory elements. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

What is claimed is:

1. A method of reading data from each of a plurality of memory cells in a spin torque magnetoresistive memory array, the method comprising:
    applying a read voltage across a source line and a bit line coupled to a memory cell;
    applying a write current in a first direction through the memory cell to write a first state;
    reapplying the read voltage across the source line and the bit line; and
    applying a programmable offset current to the one of the bit line or the source line, wherein the programmable offset current is applied during, but after initiation of, the reapplying step.

2. The method of claim 1, wherein the programmable offset current is applied during, but after a programmable delay from the initiation of, the reapplying step.

3. The method of claim 1, wherein magnitude of the programmable offset current is half of a difference between a read current through the memory cell when applying the read voltage to a memory cell in the first state and applying the read voltage to a memory cell in a second state.

4. The method of claim 1, wherein the memory cell has a resistance range, the method further comprising:
    setting a read voltage magnitude based on an applied voltage to a high or low end of the resistance range.

5. The method of claim 1, wherein the reapplying the read voltage further comprises:
    reapplying a source line voltage at a first end of the source line using a first PMOS follower circuitry and at a second end of the source line using a second PMOS follower circuitry; and
    reapplying a bit line voltage to at least one end of a bit line using a preamplifier circuitry, the bit line voltage of a higher magnitude than the source line voltage by at least the read voltage.

6. The method of claim 1, further comprising:
    isolating a first bias voltage associated with the programmable offset current prior to applying the read voltage.

7. The method of claim 1, wherein the applying a read voltage further comprises:
    applying a source line voltage at a first end of the source line using a first PMOS follower circuitry and at a second end of the source line using a second PMOS follower circuitry; and
    applying a bit line voltage to at least one end of a bit line using a preamplifier circuitry, the bit line voltage of a higher magnitude than the source line voltage by at least the read voltage.

8. The method of claim 7, further comprising:
    providing a first bias voltage for the first PMOS follower circuitry and the second PMOS follower circuitry;
    providing a second bias voltage for the preamplifier circuitry; and
    isolating the first and second bias voltages from first and second voltage supplies, respectively, prior to the applying the read voltage across the source line and the bit line coupled to the memory cell.

9. The method of claim 8, further comprising:
    coupling the first bias voltage with the second bias voltage by a capacitor.

10. A method of reading data from each of a plurality of memory cells in a spin torque magnetoresistive memory array, the method comprising:
    applying a read voltage across a magnetic tunnel junction within a memory cell;
    converting a current through the magnetic tunnel junction under the applied read voltage into a sample voltage;
    storing the sample voltage in a capacitor;
    applying a first write current through the magnetic tunnel junction to reset the memory cell to a first state;
    reapplying the read voltage across the magnetic tunnel junction;
    using the sample voltage and a programmable offset current to create a reference current;
    converting a difference between the reference current and the current through the magnetic tunnel junction under the reapplied read voltage to generate an evaluation voltage; and
    comparing the sample voltage and the evaluation voltage.

11. The method of claim 10, further comprising:
    selectively applying a second write current through the magnetic tunnel junction to set the memory cell to a second state in response to the comparing of the sample voltage and the evaluation voltage.

12. The method of claim 10, wherein the programmable offset current is applied during, but after initiation of, the reapplying step.

13. The method of claim 10, wherein the programmable offset current is applied during, but after a programmable delay from the initiation of, the reapplying step.

14. The method of claim 10, wherein magnitude of the programmable offset current is half of a difference between a read current through the memory cell when applying the read voltage to a memory cell in the first state and applying the read voltage to a memory cell in a second state.

15. The method of claim 10, wherein the memory cell has a resistance range, the method further comprising:
setting a read voltage magnitude based on an applied voltage to a high or low end of the resistance range.

16. The method of claim 10, wherein the reapplying the read voltage further comprises:
applying a source line voltage at a first end of a source line using a first PMOS follower circuitry and at a second end of the source line using a second PMOS follower circuitry; and
applying a bit line voltage to at least one end of a bit line using a preamplifier circuitry, the bit line voltage of a higher magnitude than the source line voltage by at least the read voltage.

17. The method of claim 10, further comprising:
isolating a first bias voltage associated with the programmable offset current prior to applying the read voltage.

18. The method of claim 10, wherein the applying a read voltage further comprises:
applying a source line voltage at a first end of a source line using a first PMOS follower circuitry and at a second end of the source line using a second PMOS follower circuitry; and
applying a bit line voltage to at least one end of a bit line using a preamplifier circuitry, the bit line voltage of a higher magnitude than the source line voltage by at least the read voltage.

19. The method of claim 18, further comprising:
providing a first bias voltage for the first PMOS follower circuitry and the second PMOS follower circuitry;
providing a second bias voltage for the preamplifier circuitry; and
isolating the first and second bias voltages from first and second voltage supplies, respectively, prior to applying the read voltage across the magnetic tunnel junction.

20. The method of claim 19, further comprising:
coupling the first bias voltage with the second bias voltage by a capacitor.

21. A spin torque magnetoresistive memory array having a plurality of memory cells, each memory cell of the plurality of memory cells selectively coupled between a respective bit line of a plurality of bit lines and a respective source line of a plurality of source lines, the spin torque magnetoresistive memory array comprising:
column selection circuitry coupled to first and second ends of each source line of the plurality of source lines and to a first end of each bit line of the plurality of bit lines and configured to select a specific bit line of the plurality of bit lines;
global bias circuitry configured to provide a plurality of timed bias voltages;
sense amplifiers and write drivers coupled between the column selection circuitry and the global bias circuitry, the sense amplifiers and write drivers configured to:
receive the timed bias voltages; and
for a memory cell coupled to the specific bit line:
apply a read voltage across the source line and the specific bit line coupled to the memory cell;
apply a write current in a first direction through the memory cell to write a first state;
reapply the read voltage across the source line and the specific bit line coupled to the memory cell; and
apply a programmable offset current to the specific bit line.

22. The spin torque magnetoresistive memory array of claim 21, wherein the sense amplifiers and write drivers comprise PMOS-follower circuitry coupled to one of the source line and the specific bit line coupled to the memory cell and configured to regulate a voltage thereupon.

23. The spin torque magnetoresistive memory array of claim 21, wherein the sense amplifiers and write drivers comprise PMOS-follower circuitry coupled to the source line coupled to the memory cell and configured to regulate a voltage at first and second ends of the source line.

* * * * *